US008273625B2

(12) United States Patent
Shen et al.

(10) Patent No.: US 8,273,625 B2
(45) Date of Patent: Sep. 25, 2012

(54) STRUCTURE FOR FLASH MEMORY CELLS

(75) Inventors: Ming-Huei Shen, Dounan Town (TW); Tsun-Kai Tsao, Yongkang (TW); Shih-Chang Liu, Hsin-Chu (TW); Chi-Hsin Lo, Zhubei (TW); Chia-Shiung Tsai, Hsin-Chu (TW)

(73) Assignee: Taiwan Semiconductor Manufacturing Company, Ltd., Hsin-Shu (TW)

( * ) Notice: Subject to any disclaimer, the term of this patent is extended or adjusted under 35 U.S.C. 154(b) by 197 days.

(21) Appl. No.: 12/757,172

(22) Filed: Apr. 9, 2010

(65) Prior Publication Data
US 2011/0248328 A1  Oct. 13, 2011

(51) Int. Cl.
*H01L 21/336* (2006.01)

(52) U.S. Cl. ........ 438/266; 438/267; 438/211; 438/257; 257/316; 257/E21.422

(58) Field of Classification Search .................. 257/323; 438/211
See application file for complete search history.

(56) References Cited

U.S. PATENT DOCUMENTS

| 2004/0203243 A1* | 10/2004 | Keller ........................ 438/691 |
| 2004/0238881 A1* | 12/2004 | Ozawa ........................ 257/316 |
| 2008/0248620 A1* | 10/2008 | Liu et al. .................... 438/257 |
| 2008/0268592 A1* | 10/2008 | Park et al. ................... 438/253 |

* cited by examiner

*Primary Examiner* — Michelle Mandala
*Assistant Examiner* — Shaka Scarlett
(74) *Attorney, Agent, or Firm* — Haynes and Boone, LLP

(57) ABSTRACT

A semiconductor structure is provided. The semiconductor structure includes a first floating gate on the semiconductor substrate, the floating gate having a concave side surface; a first control gate on the first floating gate; a first spacer adjacent to the first control gate; a first word line adjacent a first side of the first floating gate with a first distance; and an erase gate adjacent a second side of the first floating gate with a second distance less than the first distance, the second side being opposite the first side.

20 Claims, 4 Drawing Sheets

STRUCTURE FOR FLASH MEMORY CELLS

BACKGROUND

A typical flash memory includes a memory array having a large number of memory cells arranged in blocks. Each of the memory cells includes a field effect transistor having a control gate and a floating gate. The floating gate holds a charge and is separated from source and drain regions in a substrate by a layer of thin oxide. Each memory cell can be electrically charged by electrons injected onto the floating gate. The charge may be removed from the floating gate by tunneling to the source region or an erase gate during an erase operation. The data in flash memory cells are thus determined by the presence or absence of charge in the floating gates.

A conventional flash memory structure is substantially vertical. Spacers of specified thickness are sometimes formed between the word line and the floating gate and between the erase line and the floating gate to reduce leakage current and prevent mass program function failure. However, increasing the thickness of such spacers may also undesirably decrease the erase speed of the memory cells and increase the size of the overall memory cell structure.

There is therefore a need for a flash memory structure with reduced leakage current while maintaining a desirable erase speed. This need increases as fabrication process feature sizes decreases.

SUMMARY

The present disclosure describes a semiconductor structure for a flash memory cell. In one embodiment, the semiconductor structure includes a first floating gate on the semiconductor substrate, the floating gate having a concave side surface; a first control gate on the first floating gate; a first spacer adjacent to the first control gate; a first word line adjacent a first side of the first floating gate with a first distance; and an erase gate adjacent a second side of the first floating gate with a second distance less than the first distance, the second side being opposite the first side.

The present disclosure also describes a method of forming a semiconductor structure for a flash memory cell. In one embodiment, the method includes forming a floating gate layer above a semiconductor substrate; forming a control gate on the first floating gate; forming a first spacer adjacent the first control gate; etching the floating gate layer using a two-step etch to form a first floating gate with a concave side surface; forming a word line adjacent to a first side of the first floating gate with a first distance; and forming an erase gate adjacent to a second side of the first floating gate with a second distance less than the first distance, wherein the two-step etch includes a first etch step having a first lateral etch rate and then a second etch step having a second lateral etch rate greater than the first lateral etch rate.

The present disclosure also provides another embodiment of a semiconductor structure. The semiconductor structure includes a floating gate on a semiconductor substrate, the floating gate having a concave side surface; a control gate on the floating gate; a first spacer adjacent to the control gate; a word line adjacent a first side of the first floating gate; an erase gate adjacent a second side of the floating gate, the second side being opposite the first side; a second spacer between the word line and the floating gate, the second spacer having a first thickness; and a third spacer between the floating gate and the erase gate, the third spacer having a second thickness substantially less than the first thickness.

BRIEF DESCRIPTION OF THE DRAWINGS

For a more complete understanding of the embodiments, and the advantages thereof, reference is now made to the following descriptions taken in conjunction with the accompanying drawings in which.

DETAILED DESCRIPTION

The present disclosure relates generally to semiconductor devices, and more particularly to the structures and manufacturing methods of flash memory cells.

The making and using of the embodiments are discussed in detail below. It should be appreciated however, that the present disclosure can be embodied in a wide variety of contexts. The specific embodiments discussed are merely illustrative of specific ways to make and use the disclosure, and do not limit the scope of the disclosure.

Figure 1:
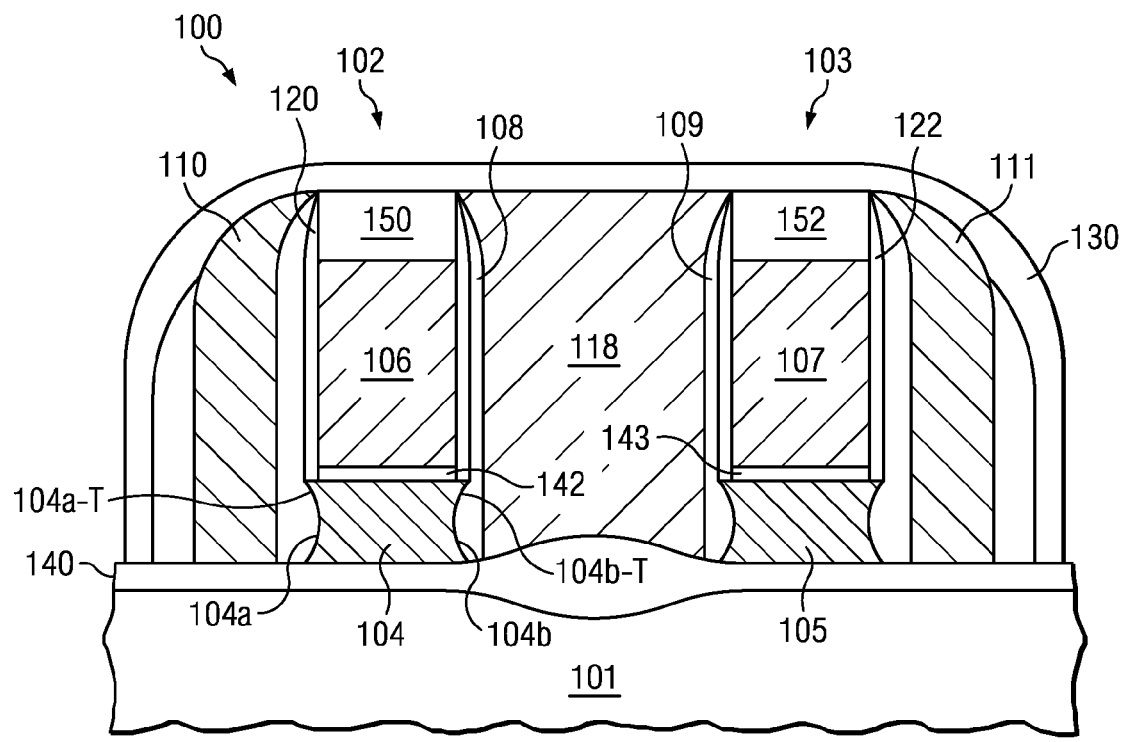
FIG. 1 is a cross-sectional view of a flash memory cell structure, according to one embodiment of the present disclosure.

FIG. 1 is a cross-sectional view of an embodiment of a flash memory cell structure 100. The structure 100 includes a semiconductor substrate 101, gate stacks 102 and 103 comprising floating gates 104 and 105 and control gates 106 and 107, respectively, spacers 108 and 109, word lines 110 and 111, erase gate 118, and spacers 120 and 122. The floating gate 104 in this embodiment comprises arched side surfaces 104a and 104b. The arched surfaces 104a and 104b are a concave side surface being recessed as compared to the side surface of the spacer 120. Each concave side surface 104a and 104b has a tip portion 104a-T and 104b-T respectively, directly below the spacer 120, and a recessed portion below the tip portion 104a-T and 104b-T. The concave surface of the sidewall 104a facing the word line increases the overall thickness of spacer 108 between the floating gate 104 and the word line 110 to reduce leakage current. The tip portion of the side wall 104b facing the erase gate decreases the shortest distance between the floating gate 104 and the erase gate 118 to secure a high erase speed. The memory cell structure 100 further includes a dielectric layer 140 interposed between the floating gates (104 and 105) and the substrate 101. The memory cell structure 100 further includes another dielectric layer 142 interposed between the floating gate 104 and the corresponding control gate 106. Similarly, the memory cell structure 100 further includes another dielectric layer 143 interposed between the floating gate 105 and the corresponding control gate 107. While FIG. 1 shows two memory cells sharing a common erase gate, the structure may comprise a single memory cell or a plurality of memory cells with various configurations or erase gate sharing.

Figure 2:
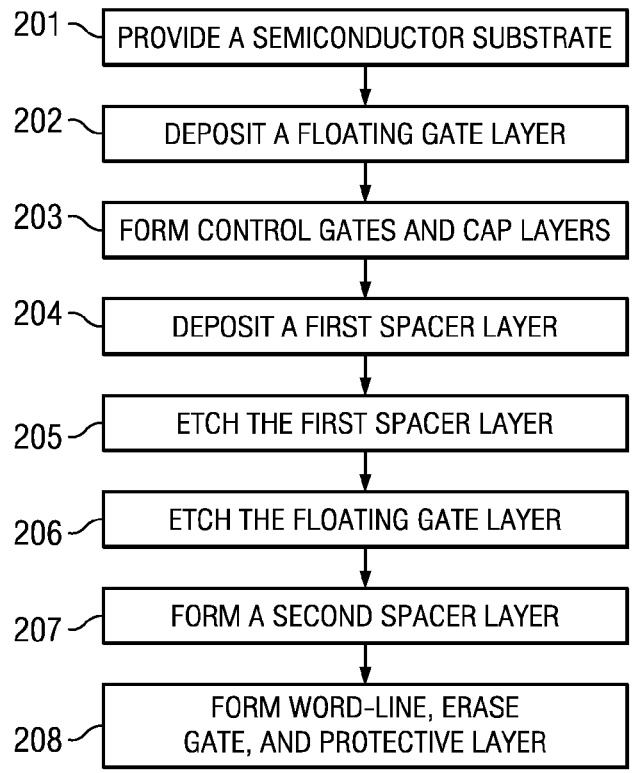
FIG. 2 is a flow chart of a method for forming a memory cell structure in accordance with one embodiment of the present disclosure.

FIG. 2 is a flowchart of a method for forming a memory cell structure in accordance with one embodiment of the present disclosure. FIGS. 3a through 3d are cross-sectional views of a flash memory cell structure in intermediate stages of formation and are described with reference FIG. 2 below.

Figure 3A:
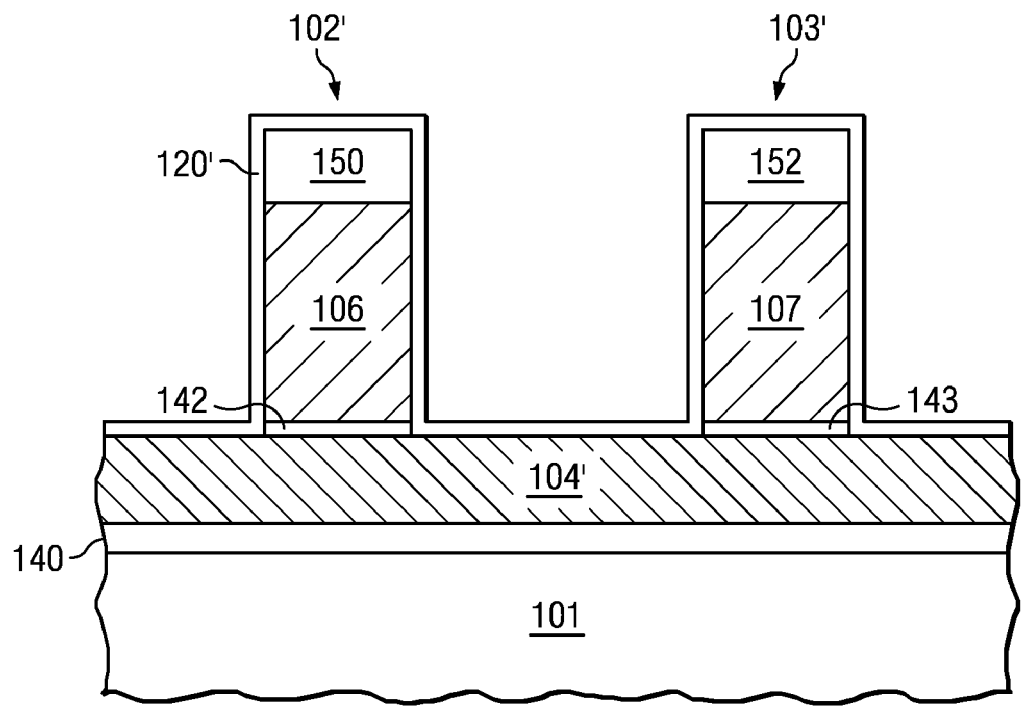
FIGS. 3a through 3d are cross-sectional views of a flash memory cell structure in intermediate stages of formation, in accordance with one embodiment of the present disclosure.

FIG. 3a shows a structure formed by steps 201 through 204 of FIG. 2. In step 201, the semiconductor substrate 101 is provided. In step 202, a floating gate layer 104' is deposited on the semiconductor substrate 101 and insulated from the substrate 101 by a dielectric layer 140. In step 203, gate stacks 102' and 103' comprising control gates 106 and 107 respectively, are formed on the floating gate layer 104'. In step 204, a first spacer layer 120' is formed over the gate stacks 102' and 103'.

The semiconductor layer 101 may include silicon or another known semiconductor material. The dielectric layer 140 may include a layer of silicon oxide. The floating gate layer 104' may include polysilicon, metal, metal silicide, metal nitride, or dielectric having a high trapping density, such as silicon nitride. The dielectric layers 142 and 143 are formed on the floating gate layer 104' and separate the floating gate layer 104' from the control gates 106 and 107 respectively. In one embodiment, the floating gate layer 104' has a thickness ranging between about 330 angstrom and about 390 angstrom. The dielectric layers 142 and 143 include a dielectric material and may be a composite layer, such as an oxide-nitride-oxide (ONO) layer, or may be formed in multiple process steps to include a plurality of layers. The control gates 106 and 107 may include polysilicon or other conductive materials. The gate stacks 102' and 103' may also include cap layer 150 and 152, such as hard mask layer employed for gate patterning. The first spacer layer 120' may be formed by depositing an ONO dielectric layer over the substrate 101 and the gate stacks 102' and 103'. The first spacer layer 120' may also include a dielectric material, such as silicon nitride, silicon oxide such as tetra-ethyl-ortho-silicate (TEOS) or high temperature oxide (HTO). The thickness of the first spacer layer 120' is preferably less than 300 Å.

Figure 3B:
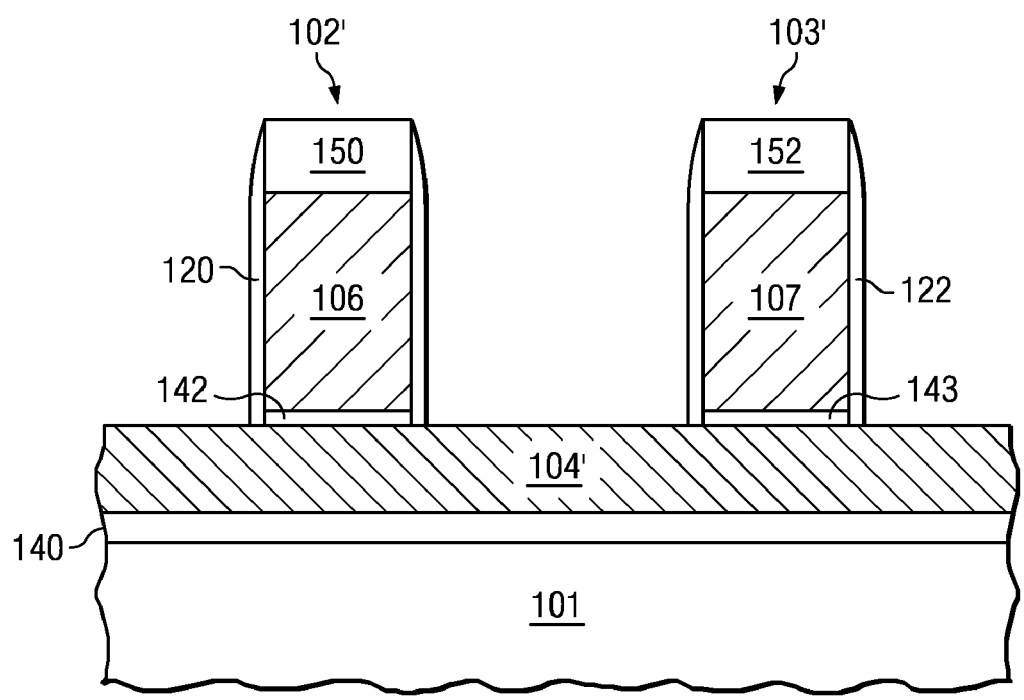

FIG. 3b shows the flash memory cells structure of FIG. 3a after a spacer layer etch step 205. An etching process performed on the structure shown in FIG. 3a removes portions of the first spacer layer 120' formed on the floating gate layer 104' and the cap layers 150 and 152 to form first spacers 120 and 121. The resulting structure partially exposes the floating gate layer 104'.

Figure 3C:
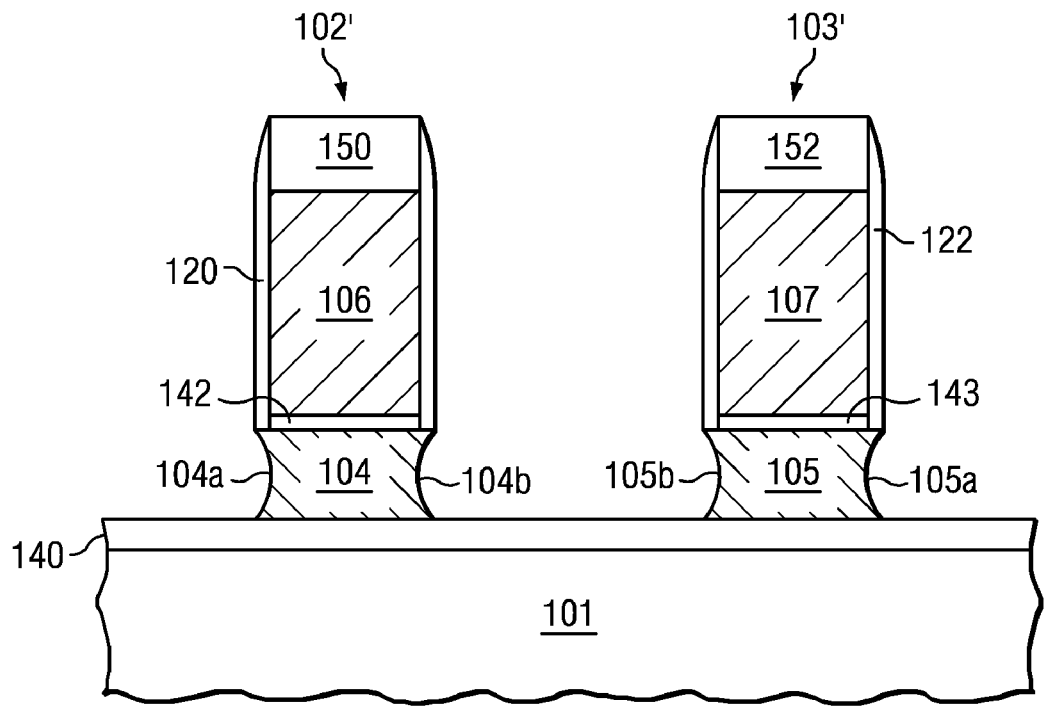

FIG. 3c shows the flash memory cell structure of FIG. 3b after a floating gate layer etch step 206. In step 206, the floating gate layer 104' is etched through a self-aligned floating gate etch to remove portions of the exposed floating gate layer 104' to form floating gates 104 and 105. The floating gate layer 104' is etched to form curved profiles 104a, 104b, 105a, and 105b and the illustrated tip structure by an etch process. The etchant used in the etch process has an etch selectivity between the polysilicon of the floating gate and the silicon oxide of the spacer. The etch rate to the polysilicon is much greater than the etch rate to the oxide. In one embodiment, the etch process includes chemicals HBr, He and HeO2. In furtherance of the present embodiment, the chemicals HBr/He/HeO2 include relative gas flows as 350/200/15, respectively. In one example, the total etch chamber pressure is maintained at about 60 mT. In one example, the etch process has an etch rate to polysilicon as about 750 angstrom/min and an etch rate to silicon oxide as about 10 angstrom/min. The etch process includes a lateral etch to the floating gate, resulting the curved profile and tip structure of the floating gate. The etch process includes a dry etching process tuned to have proper lateral etch effect. In one embodiment, the etch process includes a two step etch: a first etch step having a first lateral etch rate and then a second etch step having a second lateral etch rate greater than the first lateral etch rate.

In one embodiment, the two-step etch process includes a first etch step and then an over etch step having less bias power than that of the first etch step, for in-situ lateral etching effect to the floating gate. In one example, the first etch step has a bias power about 110 watt and the over etch step has a bias power about 45 watt. The etch process may gradually decrease the bias power to increase the lateral etch effect. In another embodiment, the two-step etch includes a first dry etch implemented in a first etch tool having a first lateral etch rate and a second dry etch implemented in a second etch tool having a second lateral etch rate greater than the first lateral etch rate. In one example, the two-step etch process may perform the first etch step at a Lam Kiyo etch tool and then perform a second etch step (over etch step) at a Lam START etch tool.

Such etching process creates an undercut of the floating gate 104 and 105 underneath the spacers 120 and 122 respectively. The undercut may be an arched surface or a recess on side surfaces 104a, 104b, 105a, and 105b of the floating gates 104 and 105. In one embodiment, the arched side surface is a concave side surface. Each side surface 104a, 104b, 105a, and 105b has a tip portion directly below the respective spacer 120 and 122, which extends approximately to the edge of the spacer 120, and a curved portion below the tip portion which is recessed in relation to the spacer 120 and the tip portion. The distance between the tip and the recessed portion of a side surface is greater than about 20 Å in width. This structure is described in more detail with reference to FIG. 4 below.

Figure 3D:
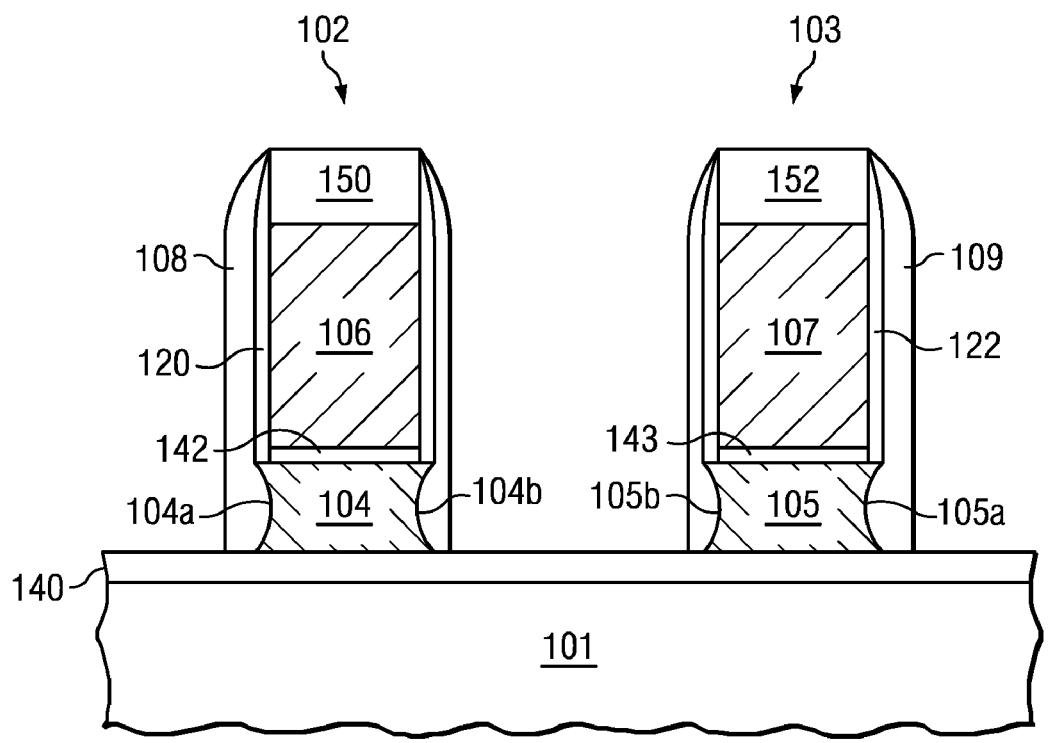

FIG. 3d shows the structure of FIG. 3c after second spacers are formed in step 207. In step 207, second spacers 108 and 109 are formed over the semiconductor substrate 101 and gate stacks 102 and 103. The second spacers 108 and 109 may be formed from an oxide layer that is first formed by high temperature deposition and that is subsequently etched to remove undesired portions. The spacers 108 and 109 may include silicon oxide, silicon nitride, or multiple layers of oxide and nitride layers. As shown in FIG. 3d, the spacers 108 and 109 may also be asymmetrical. Asymmetrical spacers 108 and 109 may be formed by etching away portions of the spacer material on one side of the spacer while the other side is protected by a photo-resist layer. More particularly, a first thickness of spacer 108 facing the word line 110 is greater than a second thickness of spacer 108 facing the erase gate 118. In one embodiment, the ratio of the first thickness to the second thickness is greater than about 3.

In step 208, word lines 111 and 110 and erase gate 118 are subsequently formed on the structure shown in FIG. 3d to result in the memory cell structure shown in FIG. 2. In one embodiment, an additional thermal oxidation step may be implemented to form a common source oxide (shown as a portion of the dielectric layer 140 in FIG. 1) on the substrate and underlying the erase gate. The cap layer may be removed after the completion of the control gate patterning. In another embodiment, a dielectric layer 130, such as silicon oxide, silicon nitride or a combination, may be formed on the flash memory device structure 100. Other features, such as various doped regions and interconnect features may be formed at proper respective stages.

Figure 4:
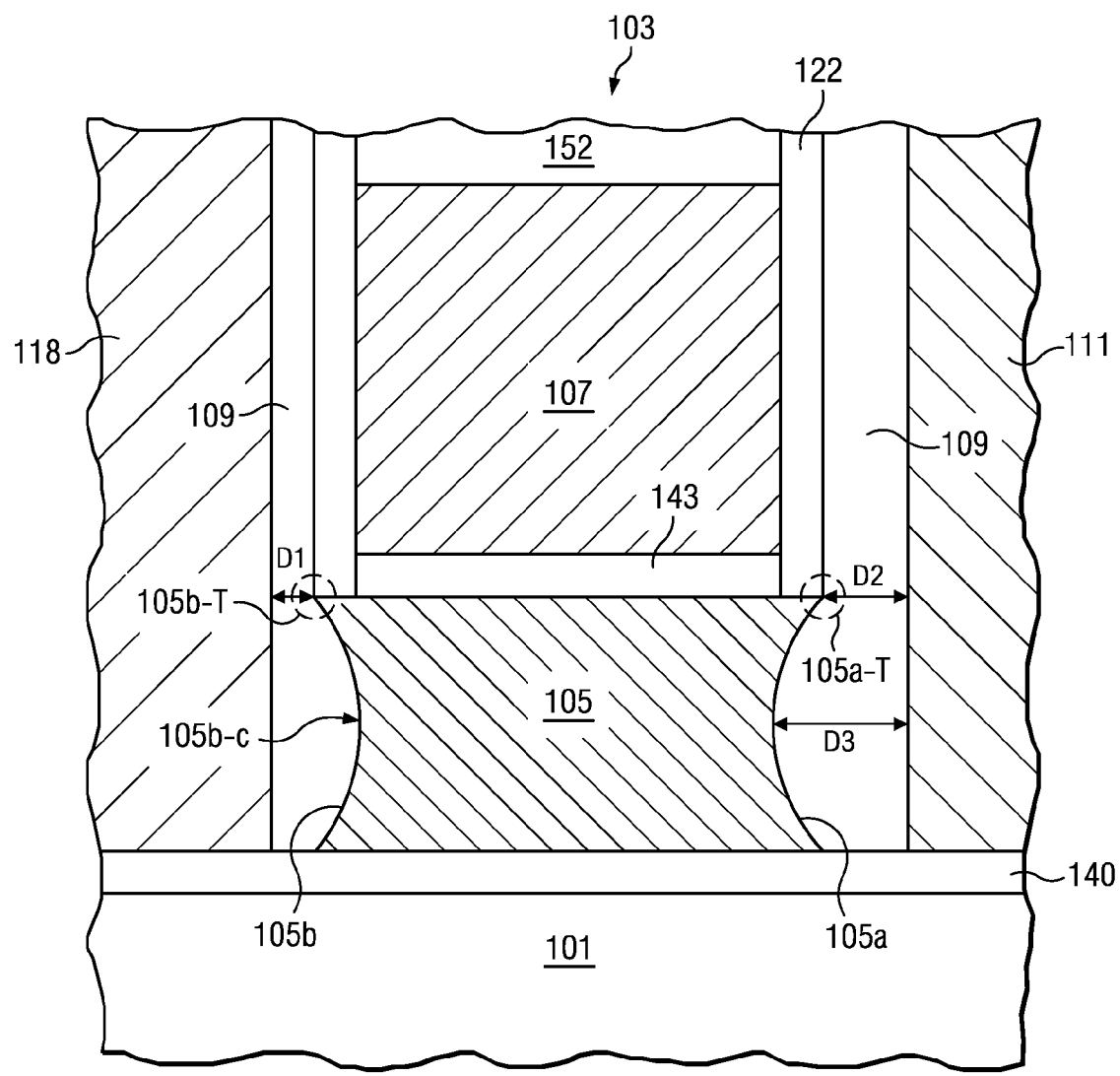
FIG. 4 is a detailed view of a portion of the flash memory cell structure shown in FIG. 1.

FIG. 4 is a detailed view of one memory cell of the flash memory cell structure 100 shown in FIG. 1. One side surface 105b of the floating gate 105 faces the erase gate 118 and is insulated from the erase gate 118 by the second spacer 109. The erase speed of the memory cell comprising floating gate 105 is influenced by a shortest distance D1 between the floating gate 105 and the erase gate 118, which is decreased by the presence of the tip feature 105b-T of the side surface 105b. In one embodiment, the distance D1 between the erase gate 118 and the tip of the side surface 205b-T is around 60 Å or smaller. A side surface 105a opposite side surface 105b of the floating gate 105 faces the word line 111. The recessed portion of the side surface 105a allows for a thicker spacer 109 without increasing the overall size of the memory cell structure. In one embodiment, the thickness of the spacer 109 may be approximately 220 Å and 250 Å at a tip D2 and a base D3 of the side surface 105a respectively. In one embodiment, the ratio D2/D1 is greater than 3. The overall thickness of the spacer 109 adjacent to the word-line that is reduced by the presence of the tip feature of the side surface 105a does not significantly affect the effectiveness of the spacer 109 in preventing leakage current and mass program function failure. A spacer 109 thickness of 200 Å or greater may effectively prevent mass program function failure. The portion of the spacer 109 between the floating gate 105 and the word line 111 may also be thicker than the portion of the spacer 109 between the floating gate 205 and the erase gate 118.

More particularly, a center position 105b-C is defined on the recessed side surface 105b of the floating gate 105 and has a same vertical distance to both the top surface and the bottom surface of the floating gate. The arched side surface 105b include a horizontal distance R from the outmost point of the tip portion 105b-T to the center position 105b-C of the recessed side surface of the floating gate 105. The thickness of the floating gate is referred to as T. A recess ratio is defined as R/T and is used to characterize the recessed side surface 105b. In one embodiment, the recess ratio R/T ranges between about 0.15 and about 0.25. Other recessed side surfaces, such as 1045a, 104a, and 104b include a similar recess ratio.

While the side surfaces 105a and 105b are shown as having a "C" shape—wider at the top and bottom edges, and narrower at the center—the side surfaces may also have an inverted "J" shape, i.e. wider at the top and straight at the bottom.

The memory cell structure shown in FIG. 1 can prevent current leakage and mass program function failure while maintaining a desirable erase speed. The manufacturing process is also simple and cost effective; no extra mask or step is required to form the concave floating gate side surface as compared to the manufacturing of a conventional memory cell structure having vertical floating gate side surfaces. Recesses in the floating gate side surfaces, which allow for thicker word-line side spacers without increasing the size of the memory cell structure, are created without adding manufacturing steps such as lateral etch or wet clean, which are necessary to create vertical recessed floating gate side surfaces. The process also creates a tip feature on the floating gate side surface which prevents the thickness of the erase gate side spacer from significantly decreasing the erase speed.

The present disclosure provides one embodiment of a semiconductor structure. The semiconductor structure includes a first floating gate on the semiconductor substrate, the floating gate having a concave side surface; a first control gate on the first floating gate; a first spacer adjacent to the first control gate; a first word line adjacent a first side of the first floating gate with a first distance; and an erase gate adjacent a second side of the first floating gate with a second distance less than the first distance, the second side being opposite the first side.

The present disclosure also provides one embodiment of a semiconductor method. The method includes forming a floating gate layer above a semiconductor substrate; forming a control gate on the first floating gate; forming a first spacer adjacent the first control gate; etching the floating gate layer using a two-step etch to form a first floating gate with a concave side surface; forming a word line adjacent to a first side of the first floating gate with a first distance; and forming an erase gate adjacent to a second side of the first floating gate with a second distance less than the first distance, wherein the two-step etch includes a first etch step having a first lateral etch rate and then a second etch step having a second lateral etch rate greater than the first lateral etch rate.

The present disclosure also provides another embodiment of a semiconductor structure. The semiconductor structure includes a floating gate on a semiconductor substrate, the floating gate having a concave side surface; a control gate on the floating gate; a first spacer adjacent to the control gate; a word line adjacent a first side of the first floating gate; an erase gate adjacent a second side of the floating gate, the second side being opposite the first side; a second spacer between the word line and the floating gate, the second spacer having a first thickness; and a third spacer between the floating gate and the erase gate, the third spacer having a second thickness substantially less than the first thickness.

Although the embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor structure comprising:
a semiconductor substrate;
a first floating gate on the semiconductor substrate, the floating gate having a concave side surface;
a first control gate on the first floating gate;
a first spacer adjacent to the first control gate;
a first word line adjacent a first side of the first floating gate with a first distance; and
an erase gate adjacent a second side of the first floating gate with a second distance less than the first distance, the second side being opposite the first side,
wherein the concave side surface has a tip portion corresponding to a widest part of the floating gate and a recessed portion corresponding to a narrowest part of the floating gate, wherein the tip portion extends to be approximately vertically aligned with an outer surface of the first spacer.

2. The semiconductor structure of claim 1 wherein the concave side surface includes a recess ratio R/T ranging between about 0.15 and about 0.25.

3. A semiconductor of claim 1 structure further comprising:
a second floating gate on the semiconductor substrate, wherein the erase gate is adjacent a first side of the second floating gate, such that the erase gate is positioned between the first and second floating gates;
a second control gate on the second floating gate; and a second word line formed adjacent to a second side of the second floating gate, the second side of the second floating gate being opposite the first side of the second floating gate.

4. The semiconductor structure of claim 1 wherein: the concave side surface is recessed relative to an outer surface of the first spacer.

5. The semiconductor structure of claim 1 wherein the concave side surface has a recess greater than about 20 Å in width.

6. The semiconductor structure of claim 1 wherein portions of the first floating gate near the first control gate and the semiconductor substrate are wider relative to a middle portion of the first floating gate.

7. The semiconductor structure of claim 1 further comprising:
a second spacer positioned between the first word line and the first floating gate; and
a third spacer positioned between the first floating gate and the erase gate.

8. The semiconductor structure of claim 7 wherein the second spacer is thicker than the third spacer.

9. The semiconductor structure of claim 7 wherein the second spacer is at least 3 times thicker than the third spacer.

10. The semiconductor structure of claim 7 wherein the second spacer has a thickness of approximately 220 Å.

11. The semiconductor structure of claim 7 wherein the first spacer has a narrow portion that has a thickness of approximately 60 Å.

12. A method comprising:
forming a floating gate layer above a semiconductor substrate;
forming a control gate on the first floating gate;
forming a first spacer adjacent the first control gate;
etching the floating gate layer using a two-step etch to form a first floating gate with a concave side surface such that a portion of the concave side surface is vertically aligned with an outer surface of the first spacer;
forming a word line adjacent to a first side of the first floating gate with a first distance; and
forming an erase gate adjacent to a second side of the first floating gate with a second distance less than the first distance, wherein the two-step etch includes a first etch step having a first lateral etch rate and then a second etch step having a second lateral etch rate greater than the first lateral etch rate.

13. The method of claim 12 wherein the two-step etch includes the first dry etch with a first bias power and the second dry etch with a second bias power less than the first bias power.

14. The method of claim 13, wherein the first bias power is about 110 watt and the second bias power is about 45 watt.

15. The method of claim 12, wherein the two-step etch includes the first dry etch step implemented in a first etch tool having the first lateral etch rate and then the second dry etch step implemented in a second etch tool having the second lateral etch rate.

16. The method of claim 12, wherein the two-step etch uses chemicals hydrogen bromide (HBr), helium (He) and helium oxide (HeO2).

17. The method of claim 12, further comprising: forming a second spacer between the word line and the floating gate; and forming a third spacer between the floating gate and the erase gate; wherein the second spacer is substantially thicker than the third spacer.

18. A semiconductor structure comprising:
a floating gate on a semiconductor substrate, the floating gate having a concave side surface having a portion that is vertically aligned with an outer surface of a first spacer;
a control gate on the floating gate;
the first spacer adjacent to the control gate;
a word line adjacent a first side of the first floating gate;
an erase gate adjacent a second side of the floating gate, the second side being opposite the first side;
a second spacer between the word line and the floating gate, the second spacer having a first thickness; and
a third spacer between the floating gate and the erase gate, the third spacer having a second thickness substantially less than the first thickness.

19. The semiconductor structure of claim 18, further comprising a word line adjacent the second spacer and an erase gate adjacent the third spacer, and
wherein the concave side surface faces the word line.

20. The semiconductor structure of claim 18, further comprising a word line adjacent the second spacer and an erase gate adjacent the third spacer, and
wherein the concave side surface faces the erase gate.

* * * * *